United States Patent
Miles

(10) Patent No.: US 7,250,315 B2
(45) Date of Patent: *Jul. 31, 2007

(54) METHOD FOR FABRICATING A STRUCTURE FOR A MICROELECTROMECHANICAL SYSTEM (MEMS) DEVICE

(75) Inventor: Mark W. Miles, San Francisco, CA (US)

(73) Assignee: IDC, LLC, San Francisco, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/941,042

(22) Filed: Sep. 14, 2004

(65) Prior Publication Data

US 2005/0142684 A1 Jun. 30, 2005

Related U.S. Application Data

(63) Continuation of application No. 10/074,562, filed on Feb. 12, 2002, now Pat. No. 6,794,119.

(51) Int. Cl.
*H01L 21/00* (2006.01)
(52) U.S. Cl. .......................... 438/29; 438/48
(58) Field of Classification Search ............ 438/22–98
See application file for complete search history.

(56) References Cited

U.S. PATENT DOCUMENTS

| | | | |
|---|---|---|---|
| 2,534,846 A | 12/1950 | Ambrose et al. | |
| 3,439,973 A | 4/1969 | Paul et al. | |
| 3,443,854 A | 5/1969 | Weiss | |
| 3,616,312 A | 10/1971 | McGriff et al. | |
| 3,653,741 A | 4/1972 | Marks | |
| 3,656,836 A | 4/1972 | de Cremoux et al. | |
| 3,725,868 A | 4/1973 | Malmer, Jr. et al. | |
| 3,813,265 A | 5/1974 | Marks | |
| 3,955,880 A | 5/1976 | Lierke | |
| 4,099,854 A | 7/1978 | Decker et al. | |
| 4,196,396 A | 4/1980 | Smith | |
| 4,228,437 A | 10/1980 | Shelton | |

(Continued)

FOREIGN PATENT DOCUMENTS

CH 681 047 12/1992

(Continued)

OTHER PUBLICATIONS

Akasaka, "Three-Dimensional IC Trends", Proceedings of IEEE, vol. 74, No. 12, pp. 1703-1714, (Dec. 1986).

(Continued)

*Primary Examiner*—Savitri Mulpuri
(74) *Attorney, Agent, or Firm*—Knobbe, Martens, Olson & Bear LLP

(57) ABSTRACT

The invention provides a microfabrication process which may be used to manufacture a MEMS device. In one embodiment, the process comprises depositing at least one first layer on a substrate. The process further comprises patterning said first layer to define at least a first portion of said microelectromechanical system device. The process further comprises depositing a second layer on said first layer. The process further comprises patterning said second layer using said first layer as a photomask. The process further comprises developing said second layer to define at least a second portion of the microelectromechanical system device.

43 Claims, 10 Drawing Sheets

U.S. PATENT DOCUMENTS

| | | |
|---|---|---|
| 4,377,324 A | 3/1983 | Durand et al. |
| 4,389,096 A | 6/1983 | Hori et al. |
| 4,392,711 A | 7/1983 | Moraw et al. |
| 4,403,248 A | 9/1983 | te Velde |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,859,060 A | 8/1989 | Kitagiri et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |

| | | |
|---|---|---|
| 5,619,365 A | 4/1997 | Rhoades et al. |
| 5,619,366 A | 4/1997 | Rhoads et al. |
| 5,622,814 A | 4/1997 | Miyata et al. |
| 5,629,790 A | 5/1997 | Neukermans et al. |
| 5,633,652 A | 5/1997 | Kanbe et al. |
| 5,636,052 A | 6/1997 | Arney et al. |
| 5,636,185 A | 6/1997 | Brewer et al. |
| 5,638,084 A | 6/1997 | Kalt |
| 5,638,946 A | 6/1997 | Zavracky |
| 5,641,391 A | 6/1997 | Hunter et al. |
| 5,646,768 A | 7/1997 | Kaeiyama |
| 5,647,819 A | 7/1997 | Fujita et al. |
| 5,650,834 A | 7/1997 | Nakagawa et al. |
| 5,650,881 A | 7/1997 | Hornbeck |
| 5,654,741 A | 8/1997 | Sampsell et al. |
| 5,657,099 A | 8/1997 | Doherty et al. |
| 5,659,374 A | 8/1997 | Gale, Jr. et al. |
| 5,665,997 A | 9/1997 | Weaver et al. |
| 5,673,139 A | 9/1997 | Johnson |
| 5,674,757 A | 10/1997 | Kim |
| 5,683,591 A | 11/1997 | Offenberg |
| 5,703,710 A | 12/1997 | Brinkman et al. |
| 5,706,022 A | 1/1998 | Hato |
| 5,710,656 A | 1/1998 | Goossen |
| 5,726,480 A | 3/1998 | Pister |
| 5,739,945 A | 4/1998 | Tayebati |
| 5,745,193 A | 4/1998 | Urbanus et al. |
| 5,745,281 A | 4/1998 | Yi et al. |
| 5,771,116 A | 6/1998 | Miller et al. |
| 5,784,190 A | 7/1998 | Worley |
| 5,784,212 A | 7/1998 | Hornbeck |
| 5,793,504 A | 8/1998 | Stoll |
| 5,808,780 A | 9/1998 | McDonald |
| 5,818,095 A | 10/1998 | Sampsell |
| 5,822,170 A | 10/1998 | Cabuz et al. |
| 5,824,608 A | 10/1998 | Gotoch et al. |
| 5,825,528 A | 10/1998 | Goosen |
| 5,835,255 A | 11/1998 | Miles |
| 5,842,088 A | 11/1998 | Thompson |
| 5,867,302 A | 2/1999 | Fleming et al. |
| 5,912,758 A | 6/1999 | Knipe et al. |
| 5,943,158 A | 8/1999 | Ford et al. |
| 5,959,763 A | 9/1999 | Bozler et al. |
| 5,972,193 A | 10/1999 | Chou et al. |
| 5,976,902 A | 11/1999 | Shih |
| 5,986,796 A | 11/1999 | Miles |
| 6,016,693 A | 1/2000 | Viani et al. |
| 6,028,690 A | 2/2000 | Carter et al. |
| 6,038,056 A | 3/2000 | Florence et al. |
| 6,040,937 A | 3/2000 | Miles |
| 6,049,317 A | 4/2000 | Thompson et al. |
| 6,055,090 A | 4/2000 | Miles |
| 6,057,903 A | 5/2000 | Colgan et al. |
| 6,061,075 A | 5/2000 | Nelson et al. |
| 6,099,132 A | 8/2000 | Kaeriyama |
| 6,100,872 A | 8/2000 | Aratani et al. |
| 6,113,239 A | 9/2000 | Sampsell et al. |
| 6,115,326 A | 9/2000 | Puma et al. |
| 6,147,790 A | 11/2000 | Meier et al. |
| 6,158,156 A | 12/2000 | Patrick |
| 6,160,833 A | 12/2000 | Floyd et al. |
| 6,166,422 A | 12/2000 | Qian et al. |
| 6,180,428 B1 | 1/2001 | Peeters et al. |
| 6,194,323 B1 | 2/2001 | Downey et al. |
| 6,195,196 B1 | 2/2001 | Kimura et al. |
| 6,201,633 B1 | 3/2001 | Peeters et al. |
| 6,204,080 B1 | 3/2001 | Hwang |
| 6,232,936 B1 | 5/2001 | Gove et al. |
| 6,243,149 B1 | 6/2001 | Swanson et al. |
| 6,246,398 B1 | 6/2001 | Koo |
| 6,249,039 B1 | 6/2001 | Harvey et al. |
| 6,282,010 B1 | 8/2001 | Sulzbach et al. |
| 6,284,560 B1 * | 9/2001 | Jech et al. .................... 438/48 |
| 6,295,154 B1 | 9/2001 | Laor et al. |
| 6,323,982 B1 | 11/2001 | Hornbeck |
| 6,327,071 B1 | 12/2001 | Kimura et al. |
| 6,329,297 B1 | 12/2001 | Balish et al. |
| 6,335,831 B2 | 1/2002 | Kowarz et al. |
| 6,351,329 B1 | 2/2002 | Greywall |
| 6,356,254 B1 | 3/2002 | Kimura |
| 6,376,787 B1 | 4/2002 | Martin et al. |
| 6,391,675 B1 | 5/2002 | Ehmke et al. |
| 6,392,233 B1 | 5/2002 | Channin et al. |
| 6,392,781 B1 | 5/2002 | Kim et al. |
| 6,407,851 B1 | 6/2002 | Islam et al. |
| 6,447,126 B1 | 9/2002 | Hornbeck |
| 6,452,465 B1 | 9/2002 | Brown et al. |
| 6,456,420 B1 | 9/2002 | Goodwin-Johansson |
| 6,465,355 B1 | 10/2002 | Horsley |
| 6,466,354 B1 | 10/2002 | Gudeman |
| 6,466,358 B2 | 10/2002 | Tew |
| 6,473,274 B1 | 10/2002 | Maimone et al. |
| 6,480,177 B2 | 11/2002 | Doherty et al. |
| 6,496,122 B2 | 12/2002 | Sampsell |
| 6,513,911 B1 | 2/2003 | Ozaki et al. |
| 6,522,801 B1 | 2/2003 | Aksyuk et al. |
| 6,531,945 B1 | 3/2003 | Ahn et al. |
| 6,537,427 B1 | 3/2003 | Raina |
| 6,545,335 B1 | 4/2003 | Chua et al. |
| 6,548,908 B2 | 4/2003 | Chua et al. |
| 6,549,338 B1 | 4/2003 | Wolverton et al. |
| 6,552,840 B2 | 4/2003 | Knipe |
| 6,574,033 B1 | 6/2003 | Chui et al. |
| 6,577,785 B1 | 6/2003 | Spahn et al. |
| 6,589,625 B1 | 7/2003 | Kothari et al. |
| 6,600,201 B2 | 7/2003 | Hartwell et al. |
| 6,606,175 B1 | 8/2003 | Sampsell et al. |
| 6,608,268 B1 | 8/2003 | Goldsmith |
| 6,610,440 B1 | 8/2003 | LaFollette et al. |
| 6,625,047 B2 | 9/2003 | Coleman, Jr. |
| 6,630,786 B2 | 10/2003 | Cummings et al. |
| 6,632,698 B2 | 10/2003 | Ives |
| 6,635,919 B1 | 10/2003 | Melendez et al. |
| 6,642,913 B1 | 11/2003 | Kimura et al. |
| 6,643,069 B2 | 11/2003 | Dewald |
| 6,650,455 B2 | 11/2003 | Miles |
| 6,657,832 B2 | 12/2003 | Williams et al. |
| 6,666,561 B1 | 12/2003 | Blakley |
| 6,674,562 B1 | 1/2004 | Miles et al. |
| 6,674,563 B2 | 1/2004 | Chui et al. |
| 6,680,792 B2 | 1/2004 | Miles |
| 6,687,896 B1 | 3/2004 | Miles |
| 6,710,908 B2 | 3/2004 | Miles et al. |
| 6,720,267 B1 | 4/2004 | Chen et al. |
| 6,736,987 B1 | 5/2004 | Cho |
| 6,741,377 B2 | 5/2004 | Miles |
| 6,741,384 B1 | 5/2004 | Martin et al. |
| 6,741,503 B1 | 5/2004 | Farris et al. |
| 6,743,570 B2 | 6/2004 | Harnett et al. |
| 6,747,785 B2 | 6/2004 | Chen et al. |
| 6,747,800 B1 | 6/2004 | Lin |
| 6,756,317 B2 | 6/2004 | Sniegowski et al. |
| 6,768,097 B1 | 7/2004 | Viktorovitch et al. |
| 6,775,174 B2 | 8/2004 | Huffman et al. |
| 6,778,155 B2 | 8/2004 | Doherty et al. |
| 6,778,306 B2 | 8/2004 | Sniegowski et al. |
| 6,794,119 B2 | 9/2004 | Miles |
| 6,811,267 B1 | 11/2004 | Allen et al. |
| 6,812,482 B2 * | 11/2004 | Fleming et al. ................ 257/17 |
| 6,819,469 B1 | 11/2004 | Koba |
| 6,822,628 B2 | 11/2004 | Dunphy et al. |
| 6,829,132 B2 | 12/2004 | Martin et al. |
| 6,853,129 B1 | 2/2005 | Cummings et al. |
| 6,855,610 B2 | 2/2005 | Tung et al. |
| 6,859,218 B1 | 2/2005 | Luman et al. |
| 6,861,277 B1 | 3/2005 | Monroe et al. |

| | | |
|---|---|---|
| 6,862,022 B2 | 3/2005 | Slupe |
| 6,862,029 B1 | 3/2005 | D'Souza et al. |
| 6,867,896 B2 | 3/2005 | Miles |
| 6,870,581 B2 | 3/2005 | Li et al. |
| 6,870,654 B2 | 3/2005 | Lin et al. |
| 6,882,458 B2 | 4/2005 | Lin et al. |
| 6,882,461 B1 | 4/2005 | Tsai et al. |
| 6,905,621 B2 | 6/2005 | Ho et al. |
| 6,912,022 B2 | 6/2005 | Lin et al. |
| 6,952,303 B2 | 10/2005 | Lin et al. |
| 6,952,304 B2 | 10/2005 | Mushika et al. |
| 6,958,847 B2 | 10/2005 | Lin |
| 6,980,350 B2 | 12/2005 | Hung et al. |
| 6,982,820 B2 | 1/2006 | Tsai |
| 6,995,890 B2 | 2/2006 | Lin |
| 6,999,225 B2 | 2/2006 | Lin |
| 6,999,236 B2 | 2/2006 | Lin |
| 2001/0003487 A1 | 6/2001 | Miles |
| 2001/0026951 A1 | 10/2001 | Vergani et al. |
| 2001/0040649 A1 | 11/2001 | Ozaki |
| 2001/0040675 A1 | 11/2001 | True et al. |
| 2002/0015215 A1 | 2/2002 | Miles |
| 2002/0021485 A1 | 2/2002 | Pilossof |
| 2002/0024711 A1 | 2/2002 | Miles |
| 2002/0036304 A1 | 3/2002 | Ehmke et al. |
| 2002/0054424 A1 | 5/2002 | Miles |
| 2002/0055253 A1 | 5/2002 | Rudhard |
| 2002/0071169 A1 | 6/2002 | Bowers et al. |
| 2002/0075555 A1 | 6/2002 | Miles |
| 2002/0086455 A1 | 7/2002 | Franosch et al. |
| 2002/0126364 A1 | 9/2002 | Miles |
| 2002/0135857 A1 | 9/2002 | Fitzpatrick et al. |
| 2002/0137072 A1 | 9/2002 | Mirkin et al. |
| 2002/0149828 A1 | 10/2002 | Miles |
| 2002/0168136 A1 | 11/2002 | Atia et al. |
| 2003/0006468 A1 | 1/2003 | Ma et al. |
| 2003/0043157 A1 | 3/2003 | Miles |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0090350 A1 | 5/2003 | Feng et al. |
| 2003/0112096 A1 | 6/2003 | Potter |
| 2003/0138213 A1 | 7/2003 | Jiin et al. |
| 2003/0152872 A1 | 8/2003 | Miles |
| 2003/0201784 A1 | 10/2003 | Potter |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2003/0231373 A1 | 12/2003 | Kowarz et al. |
| 2004/0010115 A1 | 1/2004 | Sotzing |
| 2004/0027636 A1 | 2/2004 | Miles |
| 2004/0027701 A1 | 2/2004 | Ishikawa |
| 2004/0028849 A1 | 2/2004 | Stark et al. |
| 2004/0035821 A1 | 2/2004 | Doan et al. |
| 2004/0051929 A1 | 3/2004 | Sampsell et al. |
| 2004/0053434 A1 | 3/2004 | Bruner |
| 2004/0058531 A1 | 3/2004 | Miles et al. |
| 2004/0058532 A1 | 3/2004 | Miles et al. |
| 2004/0061543 A1 | 4/2004 | Nam et al. |
| 2004/0063322 A1 | 4/2004 | Yang |
| 2004/0080807 A1 | 4/2004 | Chen et al. |
| 2004/0080832 A1 | 4/2004 | Singh |
| 2004/0087086 A1 | 5/2004 | Lee |
| 2004/0100677 A1 | 5/2004 | Huibers et al. |
| 2004/0124073 A1 | 7/2004 | Pilans et al. |
| 2004/0125281 A1 | 7/2004 | Lin et al. |
| 2004/0125282 A1 | 7/2004 | Lin et al. |
| 2004/0125536 A1 | 7/2004 | Arney et al. |
| 2004/0136076 A1 | 7/2004 | Parviz |
| 2004/0145049 A1 | 7/2004 | McKinnell et al. |
| 2004/0147811 A1 | 7/2004 | Lin et al. |
| 2004/0147056 A1 | 7/2004 | McKinnell et al. |
| 2004/0147198 A1 | 7/2004 | Lin et al. |
| 2004/0148009 A1 | 7/2004 | Buzzard |
| 2004/0150869 A1 | 8/2004 | Kasai |
| 2004/0160143 A1 | 8/2004 | Shreeve et al. |
| 2004/0174583 A1 | 9/2004 | Chen et al. |
| 2004/0175577 A1 | 9/2004 | Lin et al. |
| 2004/0179281 A1 | 9/2004 | Reboa |
| 2004/0179445 A1 | 9/2004 | Park |
| 2004/0191937 A1 | 9/2004 | Patel et al. |
| 2004/0207897 A1 | 10/2004 | Lin |
| 2004/0209192 A1 | 10/2004 | Lin et al. |
| 2004/0209195 A1 | 10/2004 | Lin |
| 2004/0212026 A1 | 10/2004 | Van Brocklin et al. |
| 2004/0217378 A1 | 11/2004 | Martin et al. |
| 2004/0217919 A1 | 11/2004 | Pichl et al. |
| 2004/0218251 A1 | 11/2004 | Piehl et al. |
| 2004/0218334 A1 | 11/2004 | Martin et al. |
| 2004/0218341 A1 | 11/2004 | Martin et al. |
| 2004/0227493 A1 | 11/2004 | Van Brocklin et al. |
| 2004/0240027 A1 | 12/2004 | Lin et al. |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0003667 A1 | 1/2005 | Lin et al. |
| 2005/0020089 A1 | 1/2005 | Shi et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0038950 A1 | 2/2005 | Adelmann |
| 2005/0042117 A1 | 2/2005 | Lin |
| 2005/0046922 A1 | 3/2005 | Lin et al. |
| 2005/0046948 A1 | 3/2005 | Lin |
| 2005/0057442 A1 | 3/2005 | Way |
| 2005/0068583 A1 | 3/2005 | Gutkowski et al. |
| 2005/0068605 A1 | 3/2005 | Tsai |
| 2005/0068606 A1 | 3/2005 | Tsai |
| 2005/0069209 A1 | 3/2005 | Damera-Venkata et al. |
| 2005/0078348 A1 | 4/2005 | Lin |
| 2005/0168849 A1 | 8/2005 | Lin |
| 2005/0195462 A1 | 9/2005 | Lin |
| 2005/0195467 A1 | 9/2005 | Kothari et al. |
| 2005/0202649 A1 | 9/2005 | Hung et al. |
| 2006/0066932 A1 | 3/2006 | Chui |

FOREIGN PATENT DOCUMENTS

| | | |
|---|---|---|
| CN | 092109265 | 11/2003 |
| DE | 199 38 072 A1 | 3/2000 |
| DE | 10228946 A1 | 1/2004 |
| EP | 0173808 | 3/1986 |
| EP | 0667548 A1 | 8/1995 |
| EP | 0694801 A | 1/1996 |
| EP | 0695959 A | 2/1996 |
| EP | 0878824 A2 | 11/1998 |
| EP | 1197778 A | 4/2002 |
| EP | 1258860 A1 | 11/2002 |
| EP | 1 452 481 A | 9/2004 |
| JP | 05275401 A1 | 10/1993 |
| JP | 10500224 | 1/1998 |
| JP | 10-148644 | 6/1998 |
| JP | 10-267658 | 10/1998 |
| JP | 11211999 A | 8/1999 |
| JP | 11243214 | 9/1999 |
| JP | 2000-40831 A | 2/2000 |
| JP | 2002 062493 | 2/2002 |
| JP | 2002-270575 | 9/2002 |
| JP | 2002-355800 | 12/2002 |
| JP | 2003001598 A | 1/2003 |
| JP | 2004-102022 A | 4/2004 |
| JP | 2004106074 A | 4/2004 |
| JP | 2004-212656 | 7/2004 |

| | | |
|---|---|---|
| JP | 2005051007 A | 2/2005 |
| KR | 157313 | 5/1991 |
| KR | 2002-9270 | 10/1999 |
| KR | 2000-0033006 | 6/2000 |
| WO | WO 92/10925 | 6/1992 |
| WO | WO9530924 | 11/1995 |
| WO | WO9717628 | 5/1997 |
| WO | WO9952006 A2 | 10/1999 |
| WO | WO9952006 A3 | 10/1999 |
| WO | WO0114248 | 3/2001 |
| WO | WO 02/24570 | 3/2002 |
| WO | WO06/036542 | 4/2002 |
| WO | WO03007049 A1 | 1/2003 |
| WO | WO 03/052506 | 6/2003 |
| WO | WO03069413 A1 | 8/2003 |
| WO | WO03073151 A1 | 9/2003 |
| WO | WO04006003 A1 | 1/2004 |
| WO | WO04026757 A2 | 4/2004 |
| WO | WO 2005/019899 A1 | 3/2005 |
| WO | WO 05/085932 A | 9/2005 |
| WO | WO 06/036385 | 4/2006 |
| WO | WO 06/036437 | 4/2006 |

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

Aratani et al., "Surface micromachined tuneable interferometer array," Sensors and Actuators, pp. 17-23. (1994).

Conner, "Hybrid Color Display Using Optical Interference Filter Array," SID Digest, pp. 577-580 (1993).

Fan et al., "Channel Drop Filters in Photonic Crystals," Optics Express, vol. 3, No. 1 (1998).

Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).

Goossen et al., "Possible Display Applications of the Silicon Mechanical Anti-Reflection Switch," Society for Information Display (1994).

Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).

Gosch, "West Germany Grabs the Lead in X-Ray Lithography," Electronics pp. 78-80 (Feb. 5, 1987).

Howard et al., "Nanometer-Scale Fabrication Techniques", VLSI Electronics: Microstructure Science, vol. 5, pp. 145-153 and pp. 166-173 (1982).

Ibbotson et al., "Comparison of XeF2 and F-atom reactions with Si and SiO2," Applied Physics Letters, vol. 44, No. 12, pp. 1129-1131 (Jun. 1984).

Jackson "Classical Electrodynamics", John Wiley & Sons Inc., pp. 568-573. (date unknown).

Jerman et al., "A Miniature Fabry-Perot Interferometer with a Corrugated Silicon Diaphragm Support", (1988).

Joannopoulos et al., "Photonic Crystals: Molding the Flow of Light," Princeton University Press (1995).

Johnson "Optical Scanners", Microwave Scanning Antennas, vol. 1, p. 251-261, (1964).

Kim et al., "Control of Optical Transmission Through Metals Perforated With Subwavelength Hole Arrays," Optic Letters, vol. 24, No. 4, pp. 256-257, (Feb. 1999).

Light over Matter, Circle No. 36 (Jun. 1993).

Lin et al., "Free-Space Micromachined Optical Switches for Optical Networking," IEEE Journal of Selected Topics in Quantum Electronics, vol. 5, No. 1, pp. 4-9. (Jan./Feb. 1999).

Little et al., "Vertically Coupled Microring Resonator Channel Dropping Filter," IEEE Photonics Technology Letters, vol. 11, No. 2, (1999).

Magel, "Integrated Optic Devices Using Micromachined Metal Membranes," SPIE vol. 2686, 0-8194-2060-Mar. (1996).

Miles, "A New Reflective FPD Technology Using Interferometric Modulation", The Proceedings of the Society for Information Display (May 11-16, 1997).

Nagami et al., "Plastic Cell Architecture: Towards Reconfigurable Computing For General-Purpose," IEEE, 0-8186-8900-, pp. 68-77, (May 1998).

Newsbreaks, "Quantum-trench devices might operate at terahertz frequencies", Laser Focus World (May 1993).

Oliner et al., "Radiating Elements and Mutual Coupling", Microwave Scanning Antennas, vol. 2, pp. 131-141, (1966).

Raley et al., "A Fabry-Perot Microinterferometer for Visible Wavelengths", IEEE Solid-State Sensor and Actuator Workshop, Jun. 1992, Hilton Head, SC.

Schnakenberg et al., "TMAHW Etchants for Silicon Micromachining," 1991 International Conference on Solid State Sensors and Actuators-Digest of Technical Papers, pp. 815-818 (1991).

Sperger et al., "High Performance Patterned All-Dielectric Interference Colour Filter for Display Applications", SID Digest, pp. 81-83, (1994).

Sriharan et al. "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.

Stone, "Radiation and Optics, An Introduction to the Classical Theory", McGraw-Hill, pp. 340-343, (1963).

Walker et al., "Electron-beam-tunable Interference Filter Spatial Light Modulator", Optics Letters vol. 13, No. 5, pp. 345-347, (May 1988).

Williams et al., "Etch Rates for Micromachining Processing," Journal of Microelectromechanical Systems, vol. 5, No. 4, pp. 256-259 (Dec. 1996).

Winters et al., "The etching of silicon with XeF2 vapor. Applied Physics Letters," vol. 34, No. 1, pp. 70-73 (Jan. 1979).

Winton, "A novel way to capture solar energy", Chemical Week, (May 1985).

Wu, "Design of a Reflective Color LCD Using Optical Interference Reflectors", ASIA Display '95, pp. 929-931, (Oct. 1995).

Zhou et al., "Waveguide Panel Display Using Electromechanical Spatial Modulators" SID Digest, vol. XXIX, (1998).

PCT/US02/13442, Search Report Sep. 13, 2002.

PCT/US04/20330 Search Report Nov. 8, 2004.

PCT/US2004/035820 International Search Report and Written Opinion Apr. 11, 2005.

PCT/US96/17731 Search Report.

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

Austrian Search Report dated Aug. 12, 2005.

Austrian Search Report dated May 4, 2005.

EP 05255661.0 European Search Report (Dec. 30, 2005).

Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.

Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.

Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).

Lee et al., "The Surface/Bulk Micromachining (SBM) Process: A New Method for Fabricating Released MEMS in Single Crystal Silicon", Journal of Microelectromechanical Systems, vol. 8, Issue 4, pp. 409-416, (Dec. 1999).

PCT/US05/029821 International Search Report (Dec. 27, 2005).

PCT/US05/030927 International Search Report (Jan. 25, 2006).

PCT/US05/031693 International Search Report.

PCT/US05/032331 International Search Report (Apr. 7, 2006).

PCT/US05/033558 Partial International Search Report (Feb. 24, 2006).

Austrian Search Report for EX72/2005 dated May 13, 2005.

Austrian Search Report for EX81/2005 dated May 18, 2005.
Austrian Search Report for EX170/2005 dated Jul. 6, 2005.
Austrian Search Report for EX139/2005 dated Jul. 27, 2005.
Austrian Search Report for EX144/2005 dated Aug. 11, 2005.
Bains, "Digital Paper Display Technology Holds Promise For Portables," CommsDesign EE Times (2000).
Bass, Handbook of Optics, vol. 1, Fundamentals, Techniques, and Design, Second Edition, McGraw-Hill, inc. New York pp. 2.29/2.36 (1995).
Chu, et al. "Formation and Microstructures of Anodic Aluminoa Films from Aluminum Sputtered onglass Substrate" Journal of the Electrochemical Society, 149 (7) B321-B327 (2002).
Crouse, "Self-ordered pore structure of anodized aluminum on silicon and pattern transfer" Applied Physics Letters, vol. 76, No. 1, Jan. 3, 2000. pp. 49-51.
French, P.J. "Development of Surface Micromachining techniques compatable with on-chip electronics" Journal of Micromechanics and Microengineering vol. 6, No. 2, 197-211 XP 002360789 Jun. (1996) IOP Publishing.
Furneaux, et al. "The Formation of Controlled-porosity membranes from Anodically Oxidized Aluminium" Nature vo 337 Jan. 12, 1989, pp. 147-149.
Jerman J. H. et al., "Maniature Fabry-Perot Interferometers Micromachined in Silicon for Use in Optical Fiber WDM Systems," Transducers. San Francisco, Jun. 24-27, 1991, Proceedings of the Internatioal Conference on Solid State Sensors Andactuators, New Youk IEEE, US, vol. Conf. 6, Jun. 24, 1991.
Lee et al., "The Surface/Bulk Micromachining (SBM) Process: A New Method for Fabricating Released MEMS in Single Crystal Silicon", Journal of Microelectromechanical Systems, vol. 8, Issue 4, pp. 409-416, (Dec. 1999).
Lieberman, "MEMS Display Looks to Give PDAs Sharper Image," EE Times (Feb. 11, 1997).
Lieberman, "Microbridges at Heart of New MEMS Displays,"EE Times (Apr. 24, 1997).
Maboudian, et al. Critical Review: Adhesion in Surface Micromechanical Structures: J. Vac. Sci Techno. B 15(1) Jan./Feb. 1997, pp. 1-20.
Microchem, LOR Lift-Off Resists Datasheet, 2002.
Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).
Miles, et al., "10.1: Digital Paper for Reflective Displays," 2002 SID International Symposium Digest of Technical Papers, Boston, MA, SID International Symposium Digest of Technical Papers, San Jose, CA, vol. 33/1, pp. 115-117 (May 21-23, 2002).
Penta Vacuum MEMS Etcher Specifications, http://www.pentavacuum.com/memes.htm.
Science and Technology, The Economist, pp. 89-90, (May 1999).
Search Report PCT/US05/030033 and Written Opinion.
Search Report PCT/US05/030902.
Search Report and Written Opinion for PCT/US05/33558 (May 19, 2005).
Search Report PCT/US05/032331 (Apr. 7, 2006).
Search Report PCT/US05/032331 (Jan. 9, 2006).
Search Report and Written Opinion for PCT/US05/032647.
Tayebi et al. "Reducing the Effects of adhesion and friction in microelectomechanical systesm (MEMS) through surface roughening: Comparision Between theory and experiments" http://jap.ajp.org/jap/copyright.isp Journal of applied Physics 98, 073528 (2005).
Thin Film Transistors—Materials and Processes—vol. 1 Amorphous Silicon Thin Film Transistors ed. Yue Kuo, Kluwer Academic Publishers, Boston (2004).
Xactix Xetch X Specifications, http://xactix.com/Xtech X3specs.htm. Jan. 5, 2005.
Xactix Xetch Product information.
Kawamura, et al., "Fabrication of fine Metal Microstructures Packaged in the bonded glass substrates" Proceedings of the Spie, The International Society for Optical Engineering Spie-Int. vol. 3893, 1999, pp. 486-493.
Supplemental European Search Report, for EP 02 72 5847, dated Aug. 14, 2006.

* cited by examiner

METHOD FOR FABRICATING A STRUCTURE FOR A MICROELECTROMECHANICAL SYSTEM (MEMS) DEVICE

RELATED APPLICATIONS

This application is a continuation of U.S. patent application Ser. No. 10/074,562, filed Feb. 12, 2002 now U.S. Pat. No. 6,794,119, which is incorporated by reference in its entirety.

FIELD OF THE INVENTION

This invention relates to microfabrication. In particular, it relates to the microfabrication of a structure for a Microelectromechanical Systems (MEMS) device.

BACKGROUND

Microfabrication techniques used to fabricate MEMS devices generally involve the deposition of one or more layers on a substrate and the subsequent patterning of the layers to produce useful structures. One technique for patterning a layer involves the use of photolithography. With photolithography a photographic definition of a desired pattern on a photo or optical mask is used to impart the pattern onto a surface of the layer. When manufacturing a MEMS device usually several masking steps are required, each masking step adding to the cost of the device. Accordingly, it is desirable to reduce the number of masking steps required during fabrication of a MEMS device.

SUMMARY OF THE INVENTION

According to one aspect of the invention there is provided a microfabrication process comprising depositing a first layer on a substrate; patterning the first layer; depositing a second layer on the first layer; and patterning the second layer using the first layer as a photomask.

DETAILED DESCRIPTION

Aspects of the present invention will now be described with reference to FIGS. 2 to 10 of the drawings which show the stages during fabrication of a MEMS device such as a Visible Spectrum Modulator Array described in U.S. Pat. No. 5,835,255 or an Interferometric Modulater (IMOD) described in U.S. Pat. No. 6,040,937. Naturally, describing the present invention with reference to stages in the manufacture of a Visible Spectrum Modulator Array or an IMOD is intended to enhance understanding of the present invention and it is to be understood that the present invention may used in the manufacture of other MEMS devices. Thus, the description of the present invention with reference to the manufacture of a Visible Spectrum Modulator Array or an IMOD is intended to be non-limiting.

Figure 1:
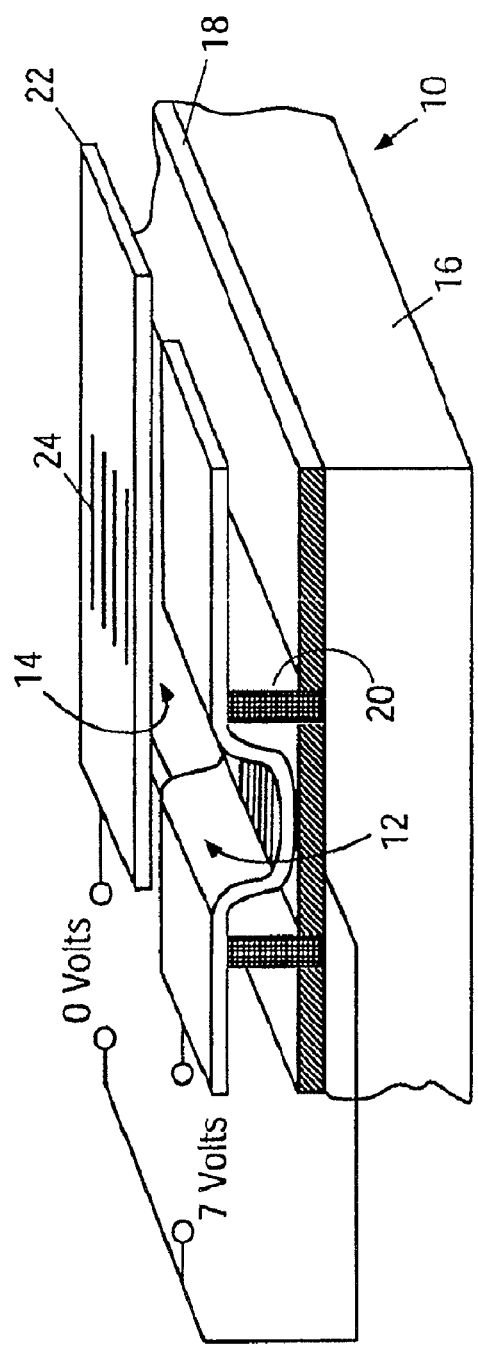
FIG. 1 shows a three dimensional drawing of a part of a MEMS device which may be manufactured using the microfabrication process of the present invention.

FIG. 1 of the drawings shows an example of a part of a Visible Spectrum Modulator Array 10 which may be fabricated in accordance with techniques described herein. Referring to FIG. 1, an antenna array is fabricated on one-half of a microfabricated interferometric cavity which transmits and reflects certain portions of incident electromagnetic radiation depending on (a) the dimensions of the cavity itself and (b) the frequency of response of dielectric mirrors in the cavities. In FIG. 1, the array 10 is shown to include two cavities 12, 14 fabricated on a transparent substrate 16. A layer 18, the primary mirror/conductor may comprise a combination of one or more films of metals, oxides, semiconductors, and transparent conductors. Insulating supports 20 hold up a second transparent conducting membrane 22. Each array element has an antenna array 24 formed on the membrane 22. The two structures 22, 24, together comprise the secondary mirror/conductor. Conversely, the antenna array may be fabricated as part of the primary mirror/conductor. Secondary, mirror/conductor 22/24 forms a flexible membrane, fabricated such that it is under tensile stress and thus parallel to the substrate, in an undriven state.

Because layers 22 and 24 are parallel, radiation which enters any of the cavities from above or below the array can undergo multiple reflections within the cavity, resulting in optical interference. Depending on the dimensions of the antenna array, the interference will determine its reflective and/or transmissive characteristics. Changing one of the dimensions, in this case the cavity height (i.e. the spacing between the inner walls of layers 18, 22), will alter the optical characteristics. The change in height is achieved by applying a voltage across the two layers of the cavity, which due to electrostatic forces, causes layer 22 to collapse. Cavity 12 is shown collapsed (7 volts applied), while cavity 14 is shown uncollapsed (0 volts applied).

Figure 2:
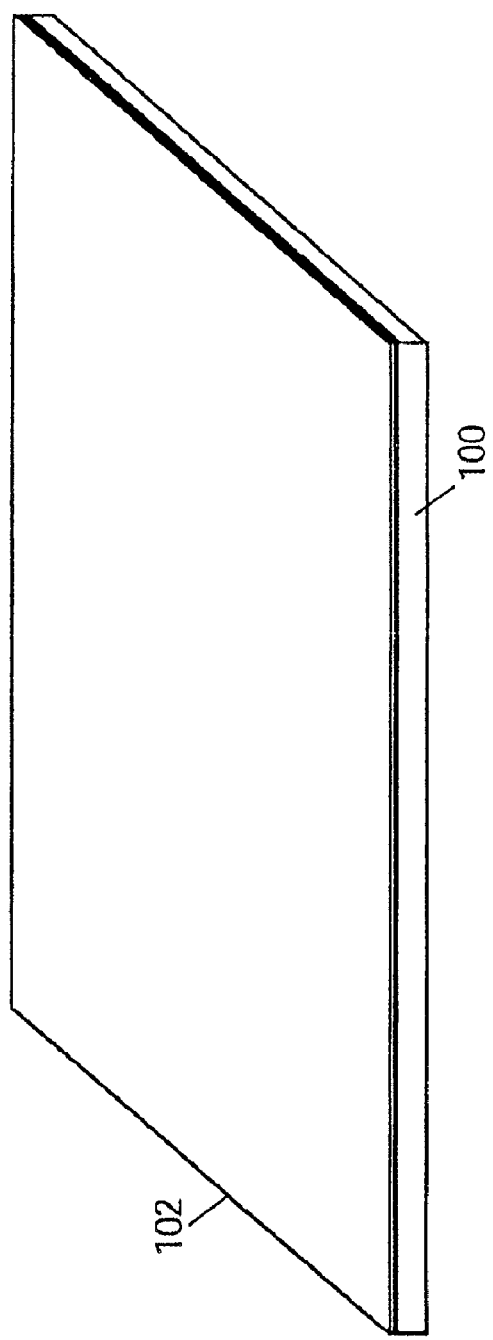
FIGS. 2 to 10 shows various stages in the manufacture of the MEMS device of FIG. 1.

In fabricating the array 10, it is desirable that insulating supports 20 are well defined in regions where contact is made between insulating supports 20 and layers 18, 22. The present invention is especially useful in manufacturing such a support. FIGS. 2 through 10 show various stages in the manufacture of a MEMS device having supports such as the supports 20. Referring to FIG. 2 of the drawings, reference numeral 100 indicates a substrate 100. The substrate 100 may be of many different materials each being transparent to ultraviolet light. Examples of these materials include plastic, mylar, or quartz. The material must be able to support an optically smooth, though not necessarily flat, finish. A preferred material would likely be glass, which would be both transmissive and reflective operation in the visible range.

Various layers are deposited on substrate 100 to define a stack. In particular, the substrate 100 is coated with a sacrificial layer 102 using standard techniques such as a physical vapor deposition (PVD) method such as sputtering or e-beam evaporation. Other possible methods include chemical vapor deposition and molecular beam epitaxy.

In FIG. 2, the sacrificial layer is a single layer. However, in other embodiments of the invention layer 102 may be a stack of layers with an uppermost sacrificial layer.

Figure 3:
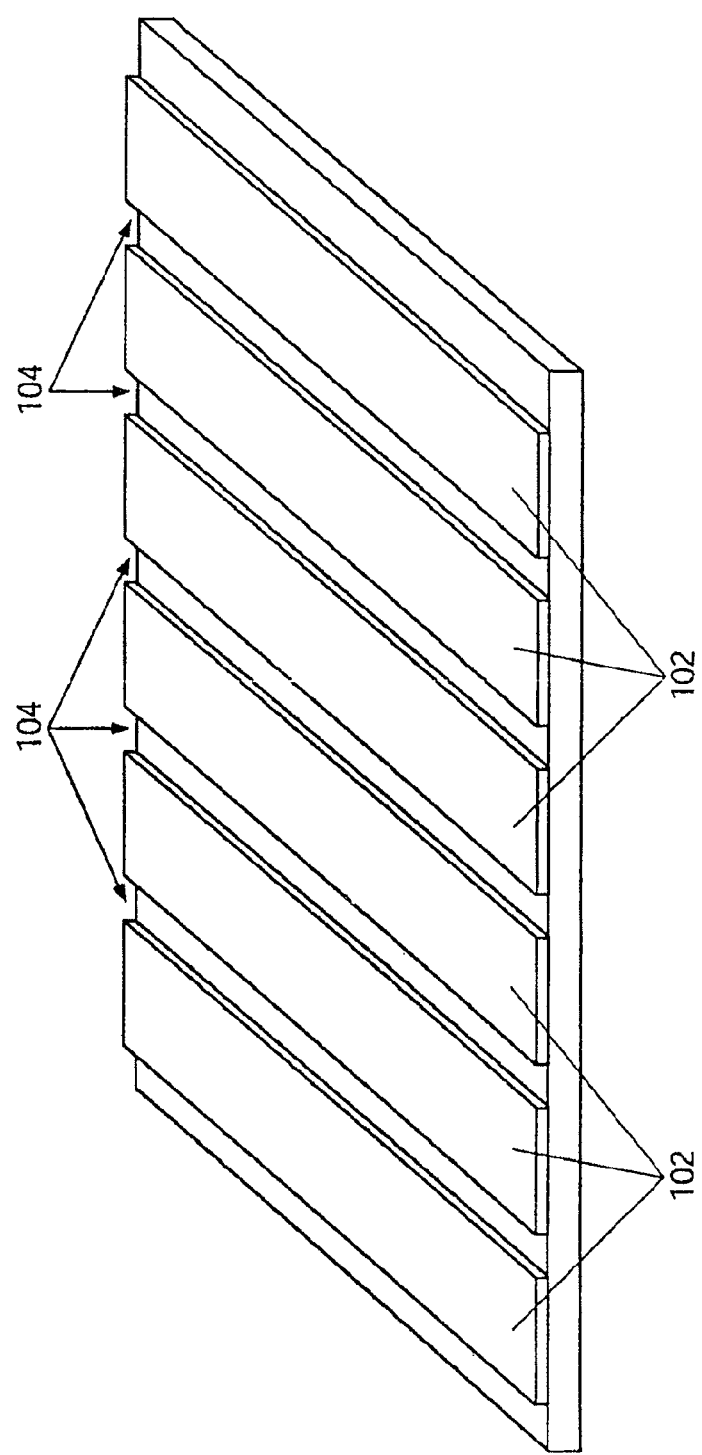

FIG. 3 of the drawings shows a stage in the manufacture of the MEMS device wherein the sacrificial layer 102 has been patterned so as to define longitudinally spaced grooves 104. A standard procedure is used to pattern sacrificial layer 102 which includes exposing layer 102 through an appropriate mask and developing to produce the pattern.

Figure 4:
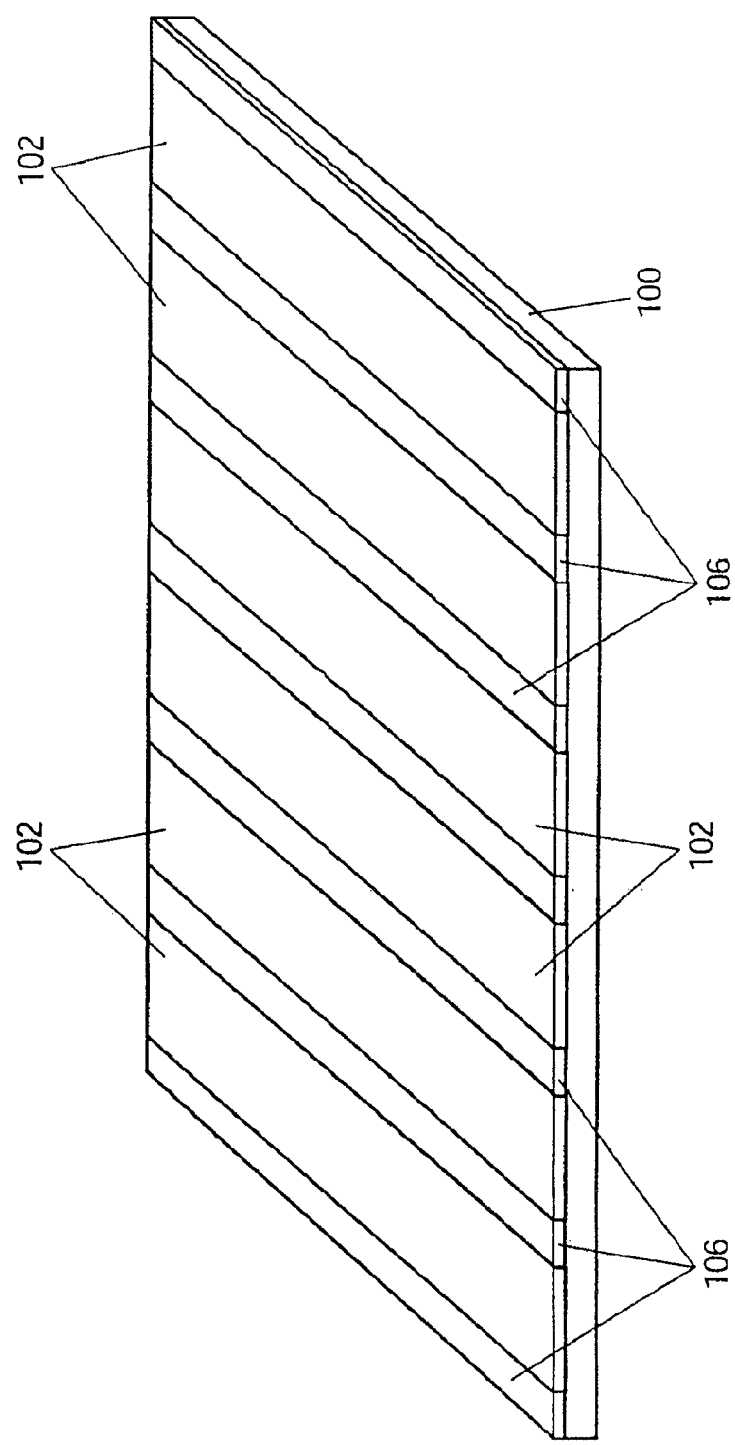
Figure 5:
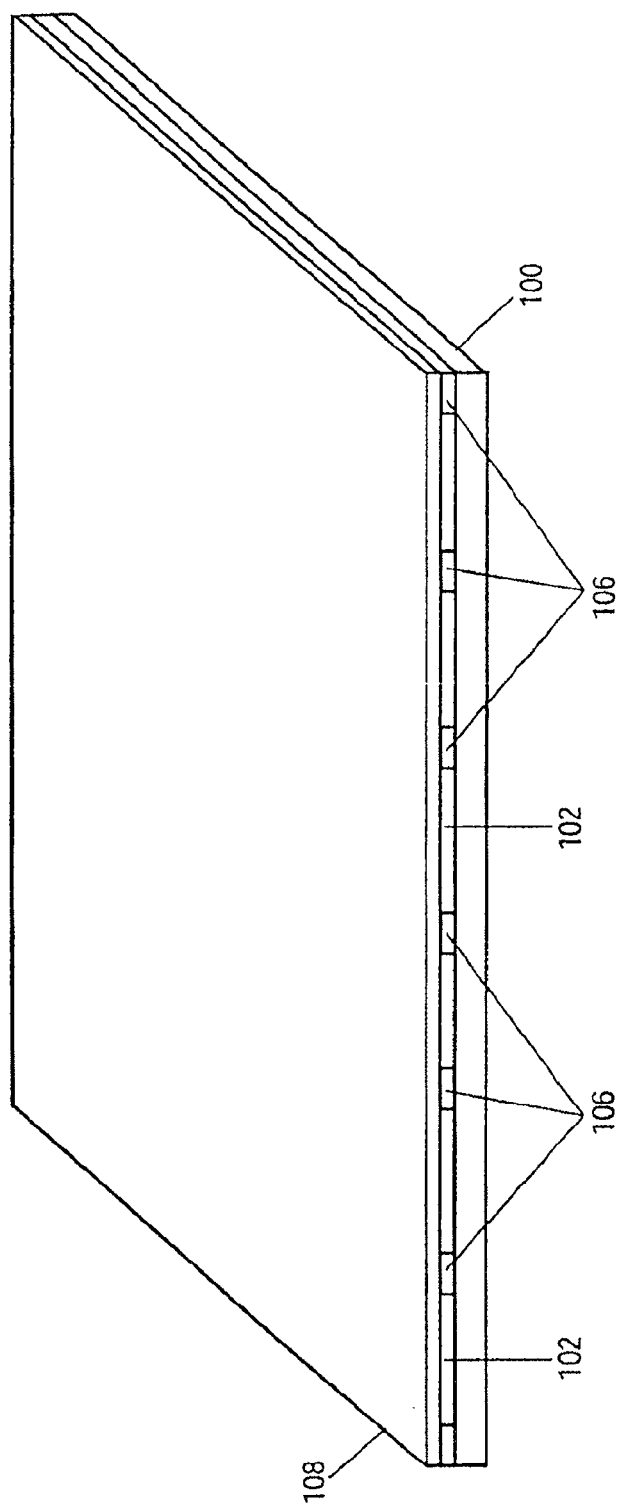

In FIG. 4 of the drawings, a photosensitive polymeric material in the form of a negative-acting-photosensitive material which could be a negative photoresist has been spun onto sacrificial layer 102 with a thickness that is larger than the total height of the film stack defined by layers 100 and 102. Thereafter, the negative-acting-photosensitive material is exposed to ultraviolet light through substrate 100 and developed using conventional techniques. Because the longitudinal grooves 104 are the only means by which the negative-acting-photosensitive material is exposed, the negative-acting-photosensitive material over the stack is dissolved during a subsequent development process, leaving only longitudinal ridges 106 of negative-acting-photosensitive material disposed in grooves 104. Thus, it will be appreciated that by first patterning the sacrificial layer 102 and then exposing the negative-acting-photosensitive material through substrate 100 through longitudinal grooves 104 in the sacrificial layer 102, the sacrificial layer 102 acts as a photomask thereby allowing the negative-acting-photosensitive material to be lithographically patterned without the need for an additional masking step. In FIG. 5 of the drawings, a structural layer 108 has been deposited on the stack and the sacrificial layer 102 has been removed, thus the layer 108 is supported by ridges 106. It will be appreciated that by using different photomasks it will be possible to fabricate support structures of any desired geometry. Thus instead of ridges, in other embodiments pillars or posts may be formed. The layer 108 is highly conductive and reflective and will typically contain aluminum and nickel.

Figure 6:
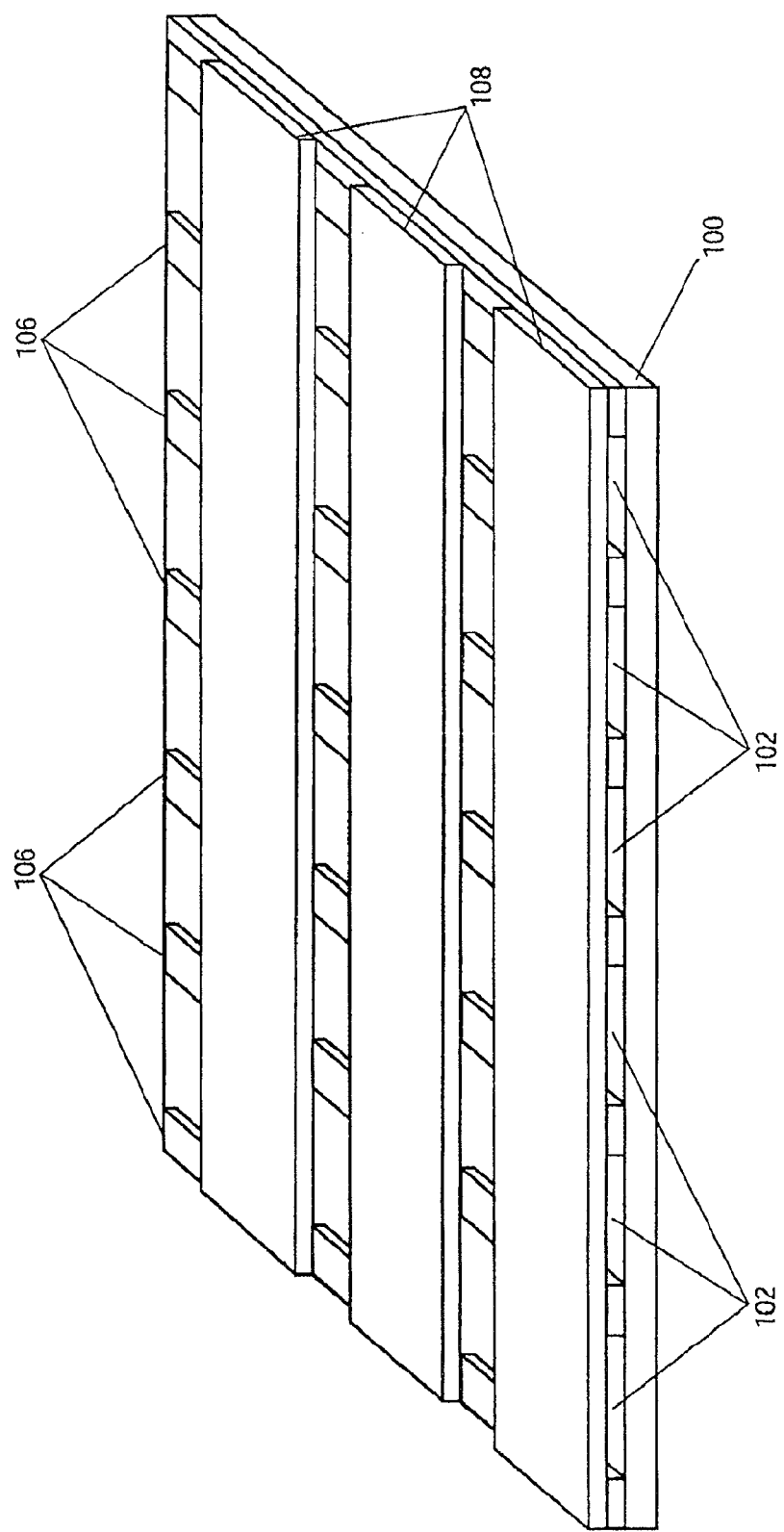
Figure 7:
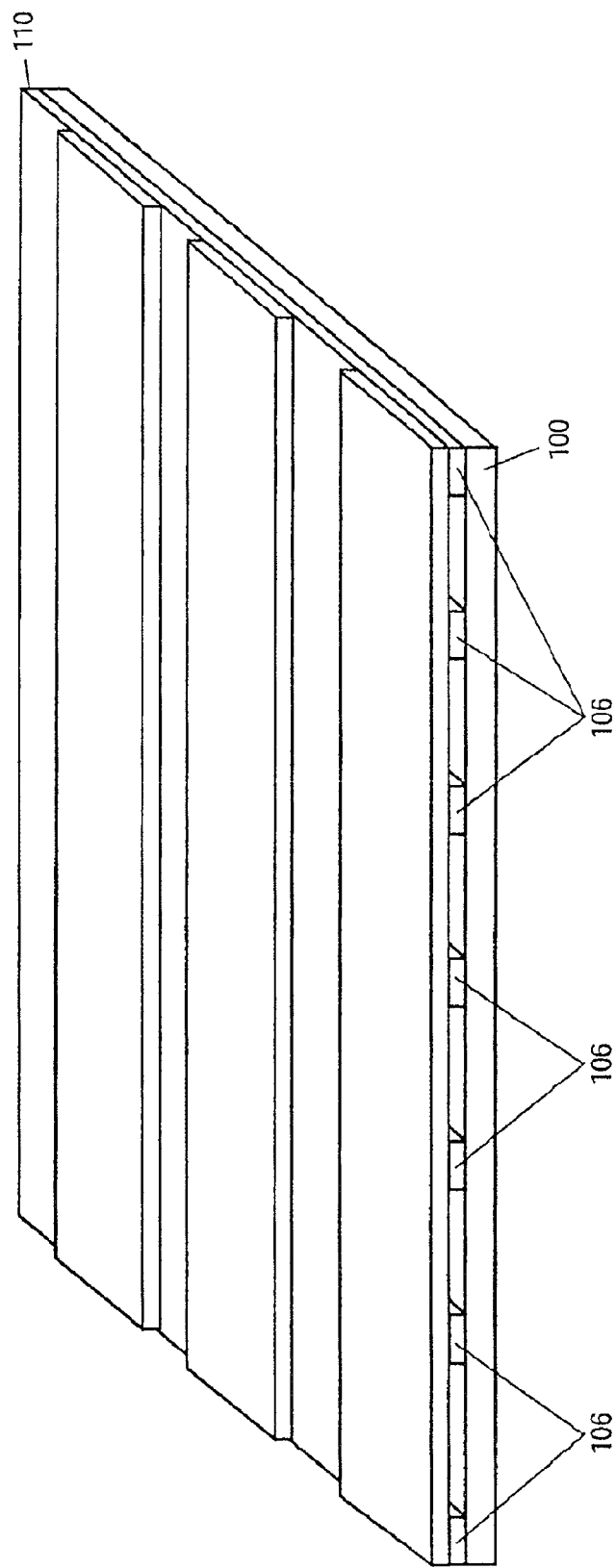
Figure 8:
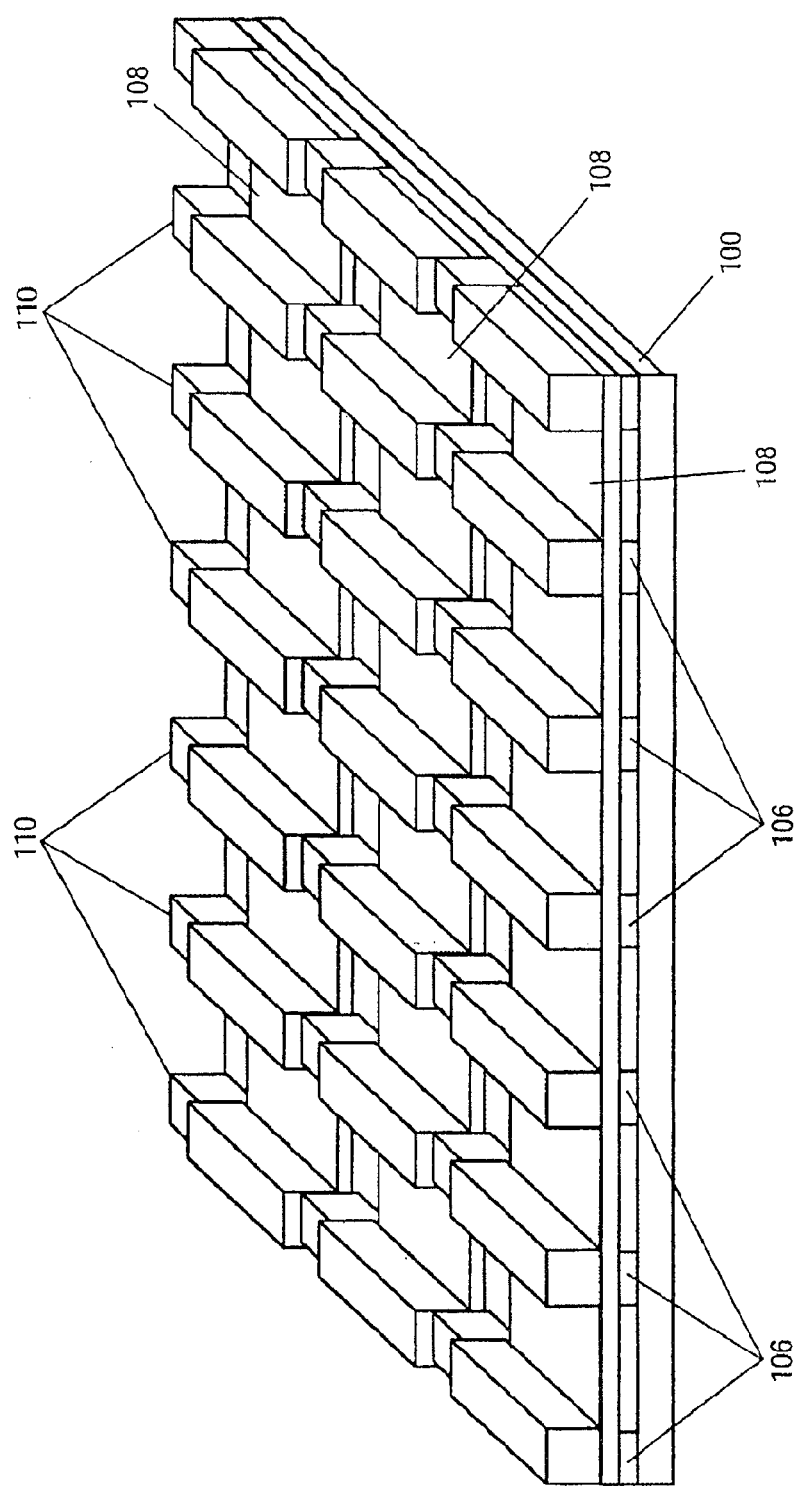
Figure 9:
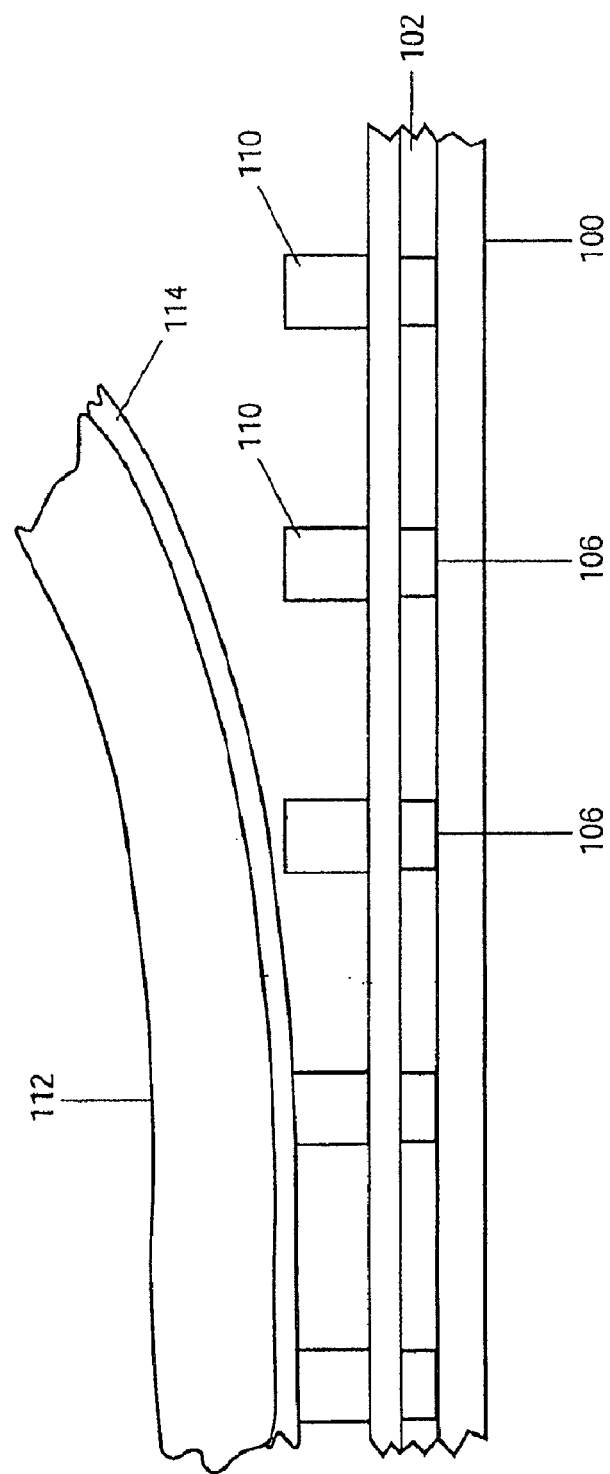
Figure 10:
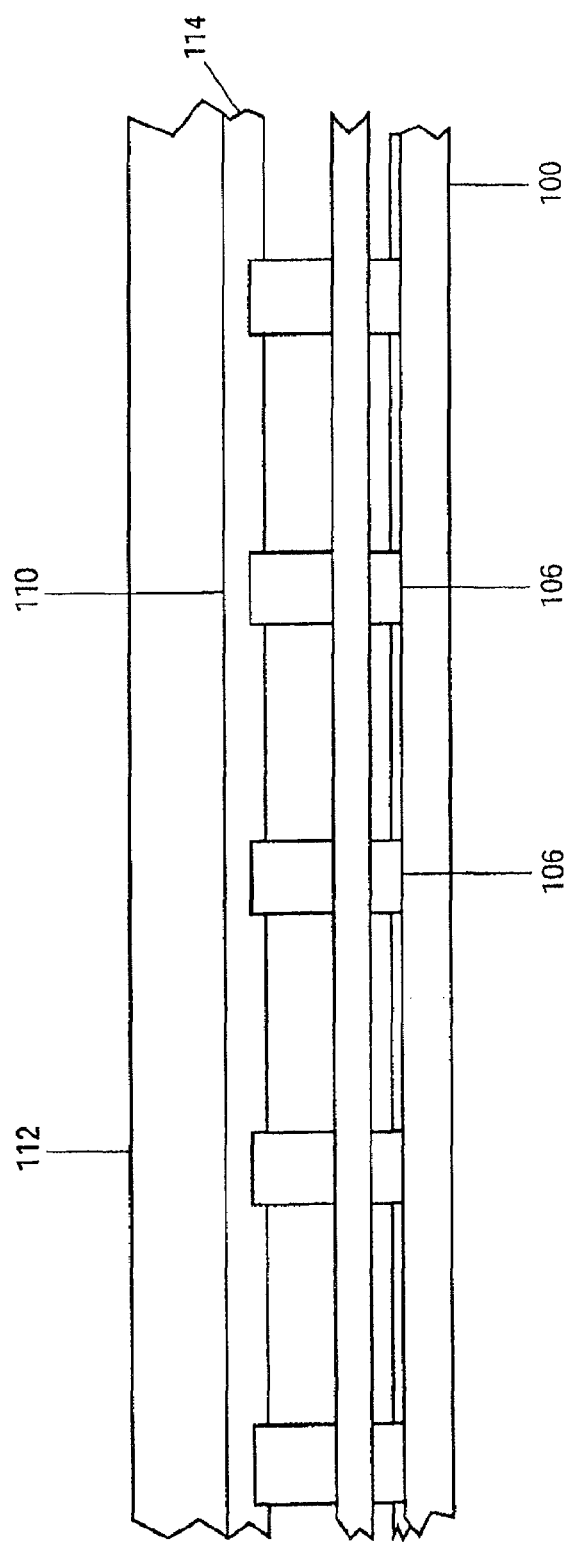

FIG. 6 of the drawings shows a subsequent stage in the manufacture of the MEMS device wherein the layer 108 is patterned into transversely extending strips. FIG. 7 of the drawings shows the film stack with an oxide spacer layer 110 deposited on layer 108. FIG. 8 of the drawings shows a stage in the manufacture of the MEMS device in which the oxide spacer layer 110 has been patterned. FIG. 9 of the drawings shows a stage in the manufacture of the MEMS device in which a sealing film 112 is being applied with a pressure adhesive 114 over the entire structure to protect the structure from damage due to mechanical shock loading and to prevent particulates from interfering with the operation of the IMOD structures. The sealing film 112 could be of a variety of materials such as thin metal films or polymeric films which have been coated with a metal or oxide film to provide hermeticity. Finally, FIG. 10 shows the structure after it has been purged with $XeF_2$ gas to remove the remains of sacrificial layer 102. The edges of the structure are then sealed.

In other embodiments, instead of oxide layer 110 another layer of negative-acting-photosensitive material may be spun over oxide layer 110 and exposed through substrate 100 and using the techniques described above a further set of support structures may be formed. These support structures will provide support for other layers. It will be appreciated that the process may be repeated to build a MEMS structure having multiple layers or "floors" stacked one on top of the other wherein the floors are vertically spaced by support structures fabricated in accordance with the above techniques. One advantage of the present invention is that it provides a microfabrication technique which allows a mechanical support between two layers in an MEMS device to be precisely defined. This allows a clean, well-defined mechanical contact between the support and other structures within the MEMS device.

Further, the present invention uses a patterned layer on a substrate as a photomask to pattern another layer, thereby saving on a masking step.

Although the present invention has been described with reference to specific exemplary embodiments, it will be evident that the various modification and changes can be made to these embodiments without departing from the broader spirit of the invention as set forth in the claims. Accordingly, the specification and drawings are to be regarded in an illustrative sense rather than in a restrictive sense.

What is claimed is:

1. A method of fabricating a microelectromechanical system device, comprising:
   forming a first conductive layer on a substrate;
   depositing at least one first layer on the first conductive layer;
   patterning said first layer to define at least a first portion of said microelectromechanical system device;
   depositing a second layer on said first layer, wherein the second layer comprises a negative-acting photoresist;
   patterning said second layer using said first layer as a photomask;
   developing said second layer to form a plurality of a supports of the microelectromechanical system device; and
   forming a structural layer over the supports.

2. The method of claim 1, wherein the substrate is configured to be transmissive to light.

3. The method of claim 2, wherein the substrate comprises glass.

4. The method of claim 1, wherein patterning the first layer comprises forming a plurality of longitudinally spaced grooves therein.

5. The method of claim 4, wherein patterning the second layer comprises exposing the second layer to light, wherein the light is passed through at least one of the plurality of longitudinally spaced grooves in the first layer.

6. The method of claim 5, wherein developing the second layer comprises forming longitudinally spaced ridges disposed in the grooves in the first layer.

7. The method of claim 1, further comprising patterning the structural layer.

8. The method of claim 7, wherein patterning the third layer comprises forming strips that extend in a direction transverse to the longitudinally spaced grooves in the first layer.

9. The method of claim 8, wherein the transversely extending strips are supported by the longitudinally spaced ridges formed from the second layer.

10. The method of claim 1, wherein the structural layer comprises nickel and aluminum.

11. The method of claim 1, wherein the first layer comprises a sacrificial material and further comprising substantially removing the first layer.

12. A method of forming a microelectromechanical system (MEMS) device, the method comprising:
   depositing a conductive layer over a substrate;
   forming a first layer over the conductive layer;
   forming a first element over the first layer;
   forming a spacer layer over the first element;
   forming a first support element over the first element;
   forming a first support element of the microelectromechanical system device over the first element;
   forming a second element over at least a portion of the first support element; and substantially removing the first layer.

13. The method of claim 12, further comprising patterning at least a portion of the first layer prior to forming a first element over the first layer.

14. The method of claim 12, wherein forming a first element over the first layer comprises patterning at least a portion of the first element.

15. The method of claim 13, wherein forming a first element over the first layer comprises forming at least a portion of the first element within the patterned portion of the first layer.

16. The method of claim 12, wherein at least a portion of each of the first layer and the second spacer layer is substantially planer.

17. The method of claim 12, further comprising patterning at least a portion of the second spacer layer prior to forming the first support element over the first element.

18. The method of claim 17, wherein forming a first support element over the first element comprises forming at least a portion of the first support element within the patterned portion of the second spacer material.

19. The method of claim 17, wherein forming a first support element over the first element comprises patterning at least a portion of the first support element.

20. The method of claim 12, further comprising forming a second support clement over the first element.

21. The method of claim 20, wherein forming a second support element over the first element occurs prior to substantially removing the first layer.

22. The method of claim 12, wherein the first layer and the second spacer layer each comprises a sacrificial material.

23. The method of claim 12, wherein at least a portion of the second element comprises a metallic or polymeric material.

24. The method of claim 12 wherein at least a portion of the first element comprises a highly reflective or conductive material.

25. The method of claim 24, wherein at least a portion of the first element comprises aluminum or nickel.

26. The method of claim 12, wherein the first support element comprises support structures formed by patterning the second spacer layer, wherein the support structures are configured to provide support for the second element relative to the first element.

27. The method of claim 12, wherein the first support element is configured to provide support for the second element relative to the first element.

28. A method of forming a microelectromechanical system (MEMS) device, the method comprising:
providing a substrate;
providing a conductive material over the substrate;
providing a first sacrificial material over the conductive layer;
patterning the first sacrificial material;
forming a first material over the first sacrificial material such that at least a portion of the first material contacts at least a portion of the conductive material;
providing a second sacrificial material over the first material;
forming a support material over the first material;
forming a second material over at least a portion of the support material; and
substantially removing the first sacrificial material.

29. The method of claim 28, wherein forming a support material over the first material comprises patterning the second sacrificial material such that the support material is configured to provide support for the second material relative to the first material.

30. A method of forming a microelectromechanical system (MEMS) device, the method comprising:
providing a substrate;
providing a first conductive layer over at least a portion of the substrate;
providing a second conductive layer over at least a portion of the first conductive layer;
forming a spacer layer over at least a portion of the second conductive layer;
patterning the spacer layer to form a plurality of supports of the microelectromechanical system device; and
applying a film over the plurality of supports, wherein at least a portion of the film is disposed over at least a portion of the second conductive layer, and wherein at least a portion of the film is is supported by the plurality of supports.

31. The method of claim 30, wherein the substrate is configured to be transmissive to light.

32. The method of claim 30, wherein the spacer layer comprises an oxide material.

33. The method of claim 30, wherein the second conductive layer is conductive and reflective.

34. The method of claim 30, wherein the at least one support comprises an elongated spacer.

35. The method of claim 34, wherein the second conductive layer extends in a direction transverse to the elongated spacer.

36. The method of claim 35, wherein the first conductive layer extends in a direction parallel to the elongated spacer.

37. The method of claim 34, further comprising a plurality of said supports.

38. The method of claim 30, wherein the film comprises at least one of the following materials: a thin metal film and a polymeric film.

39. The method of claim 38, wherein the film is configured to provide hermeticity for at least a portion of the device.

40. The method of claim 30, further comprising
providing at least one ridge over at least a portion of the substrate, wherein the at least one ridge is configured to provide support for at least a portion of the second conductive layer.

41. The method of claim 40, wherein the at least one support is disposed over at least a portion of the at least one ridge.

42. The method of claim 41, wherein the at least one support is sbstantially parallel to the at least one ridge.

43. The method of claim 1, wherein the microelectomechanical system device comprises an interferometric modulator.

* * * * *